(12) United States Patent
Fujii et al.

(10) Patent No.: US 6,339,341 B1
(45) Date of Patent: Jan. 15, 2002

(54) PROGRAMMABLE LOGIC LSI

(75) Inventors: Taro Fujii; Koichiro Furuta; Masato Motomura, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/498,754

(22) Filed: Feb. 7, 2000

(30) Foreign Application Priority Data

Feb. 9, 1999 (JP) ............................................. 11-031655

(51) Int. Cl.[7] .............................................. H03K 19/173
(52) U.S. Cl. ............................ 326/38; 326/39; 326/40; 326/41
(58) Field of Search ............................ 326/39, 38, 40, 326/41

(56) References Cited

U.S. PATENT DOCUMENTS

| | | | | |
|---|---|---|---|---|
| 5,787,007 A | * | 7/1998 | Bauer ......................... | 364/489 |
| 5,815,004 A | * | 9/1998 | Trimberger et al. .......... | 326/41 |
| 5,825,203 A | * | 10/1998 | Kusunoki et al. ............. | 326/41 |

FOREIGN PATENT DOCUMENTS

| | | |
|---|---|---|
| GB | 2 286 737 | 8/1995 |
| JP | 4-188649 | 7/1992 |
| JP | 6-6209 | 1/1994 |
| JP | 07-58630 | 3/1995 |
| JP | 8-102492 | 4/1996 |
| JP | 8-250685 | 9/1996 |
| JP | 9-148440 | 6/1997 |

* cited by examiner

*Primary Examiner*—Patrick Wamsley
*Assistant Examiner*—Vibol Tan
(74) *Attorney, Agent, or Firm*—Sughrue, Mion, Zinn, Macpeak & Seas, PLLC

(57) ABSTRACT

To decrease a number of cells for programmable wiring means in a programmable logic LSI. An element cell as programmable logic means in the programmable logic LSI comprises a memory circuit, a read-out circuit, and an inter-cell connection control circuit. The element cell unit functions also as programmable wiring means. Further, the input/output connections for a plurality of the element cells are assured by twisting inter-cell connection lines 108. Furthermore, a feed-back loop is formed by connecting input/output signal lines, when the element cell is operating as programmable logic means.

12 Claims, 14 Drawing Sheets

F I G.14
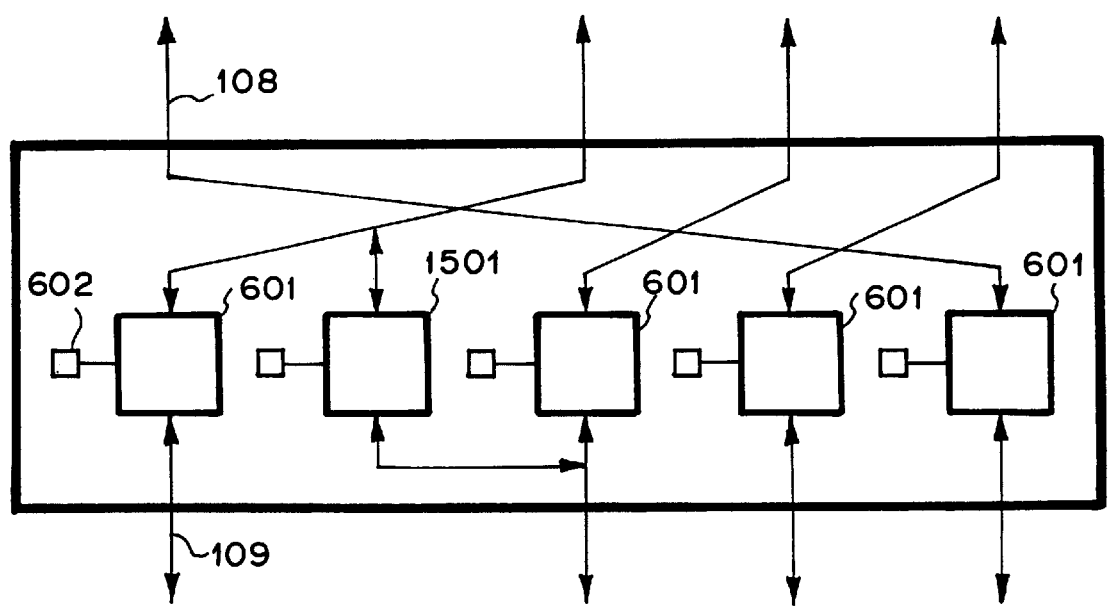

PROGRAMMABLE LOGIC LSI

BACKGROUND OF THE INVENTION

1. Technical Field of the Invention

The present invention relates to a programmable logic LSI such as a field programmable gate array (FPGA), wherein element cells are used either for logic function or for wiring function such as a cross bar switch.

2. Description of the Prior Art

The programmable logic LSI such as FPGA is an LSI for implementing a hardware, according to configuration information stored in the LSI itself. As the scale of hardware becomes enlarged, Gate arrays are being replaced by programmable logic LSI such as FPGA. In general, the programmable logic LSI comprises logic cells, wiring cells, and input/output cells. There is disclosed, in JP appl.no.10-309285 (1998), a programmable logic LSI which integrates the logic cell and wiring cell in order to change freely a ratio of wiring resources to logic resources, although concrete method for constructing the cells is not disclosed.

It is necessary to fix the connections between the input/output terminals of the cells, when a plurality of cells for programmable logic means are assembled.

The first measure is to heighten a degree of freedom for selecting the locations of input/output terminals of each cell, and to assure the input/output terminals for sequenced cells. The second measure is to insert programmable wiring cell between programmable logic cells. Further, the third measure is to assure the input/output terminals for sequenced cells, by constructing an LSI which comprises a plurality of cells of which input/output locations are different from each other.

In JP 9-148440A (1997), variable logic blocks and switch matrices are arranged in a checker flag pattern, wherein connection wiring region is provided on the variable logic blocks by applying multi-layer wiring technique, whereby the area of the switching matrices among the logic blocks is reduced and the chip size is also reduced. Further, signal delay is reduced, because the number of switches on the connection lines between the logic blocks is reduced.

However, the circuit scale in each cell is increased, when adopting the first measure as mentioned-above. Further, cell number is increased, when adopting the second measure as mentioned-above. Furthermore, when adopting the third measure as mentioned above, the hardware becomes complicated, because various types of cells must be used.

Further, the conventional programmable logic LSI as disclosed in the above-mentioned Japanese Patent Application No. 10-309285 (1998) has a disadvantage that the resources are not fully utilized, because the wiring resource is not utilized, when the LSI is utilized as a programmable logic means. Furthermore, it has another disadvantage that the wiring resource is apt to become floated, when the wiring resource is not utilized.

SUMMARY OF THE INVENTION

Therefore, an object of the present invention is to simplify the hardware construction by using cells which is an array of element circuits.

Another object of the present invention is to increase cells for programmable logic means and memory means, without increasing the circuit scale of each cell. In other words, the object of the invention is to decrease the programmable wiring means.

Still another object of the present invention is to suppress an overhead and to prevent an occurrence of floating state on the wiring means which are not operating.

The programmable logic LSI includes a two dimensional array of element cells which functions as programmable wiring means, programmable logic means and memory means. Each of the element cells comprises a plurality of inter-cell connection control circuits for controlling connections between the element cells, and a logic/wiring integration circuit for operating as a cross-bar switch as the wiring means and for inputting and outputting logic signals as the logic means and the memory means. The logic/wiring integration circuit comprises memory circuits for storing the logic signals, read-out circuits for reading out the logic signals, and switches for switching on and off the connections between the element cells.

Each of the element cells may include a write circuit for writing the logic signals.

In the programmable logic LSI of the present invention, element cells as many as required are used as logic means or wiring means.

According to the present invention, a programmable logic LSI which integrates programmable logic means, and programmable wiring means and memory means can be implemented by a two- dimensional array of element cells.

Further, according to the present invention, a degree of freedom of connecting the programmable logic cells with each other becomes high, because the connections in the element cell can be devised variously, and a logic element cell can function as a wiring element cell. Therefore, the element cells are utilized efficiently, because a number of wiring element cells can be suppressed, when more logic element cells are required.

Furthermore, according to the present invention, the floating state on the connection lines can be avoided, because the signal value on the connection lines are latched on the basis of the value stored in the memory means.

BRIEF EXPLANATION OF THE DRAWINGS

FIGS. 14 is a block diagram of an example of inter-cell connection control circuit as shown in FIG. 1, wherein one of the bi-directional connection lines are not twisted.

PREFERRED EMBODIMENT OF THE INVENTION

Figure 1:
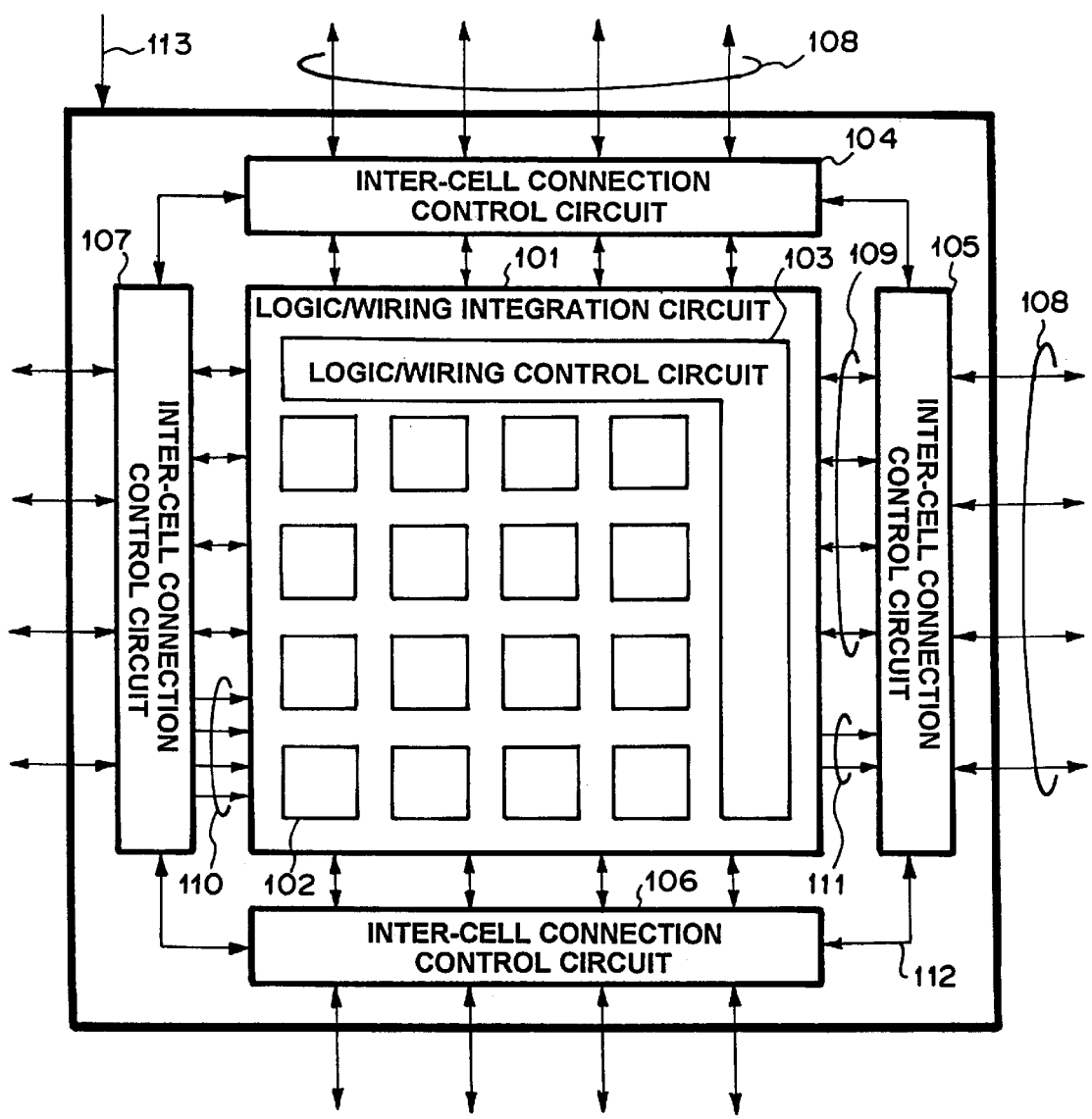
FIG. 1 is a block diagram of an element cell in the programmable logic LSI of the present invention.

Modes of embodiment of the present invention are explained, referring to the drawings.

An element cell of a programmable logic LSI of the present invention is shown in FIG. 1. Element cell 1 comprises logic/wiring integration circuit 101, inter-cell connection control circuits 104 to 107, a plurality of bi-directional connection lines 108, internal bi-directional connection line 109, logic input lines 110, logic output line 111, and connection control line 112. A number of indirect connection lines is not limited to 4, although four lines are shown in FIG. 1.

Element cell 1 is connected with adjacent element cells by bi-directional connection line 108. Further, inter-cell connection control circuits 104 to 107, as well as logic/wiring integration circuit 101 comprises internal bi-directional connection line 109, logic input lines 110, and logic output line 111. The location and number of cell indirect connection control circuits 104 to 107 are not limited to those as shown in FIG. 1.

Logic/wiring integration circuit 101 comprises an array of logic/wiring integration unit circuits 102 and logic/wiring integration control circuit 103. Logic/wiring integration circuit 101 functions as either one of a programmable logic circuit, a programmable wiring circuit, or a memory circuit, depending upon a signal value from mode information line 113.

Concretely, logic/wiring integration circuit 101 as a programmable wiring circuit is a croos-bar switch between internal bi-directional connection line 109, while logic/ programmable integration circuit as a programmable logic circuit or a memory circuit feeds output signals onto logic output line 111 on the basis of input signals from logic input lines.

Cell connection control circuits 104 to 107 control the connections between logic/wiring integration circuit 101 and the corresponding logic/wiring integration circuit in the adjacent element cell. This connections are controlled by the signal value from mode information line 113.

Figure 2:
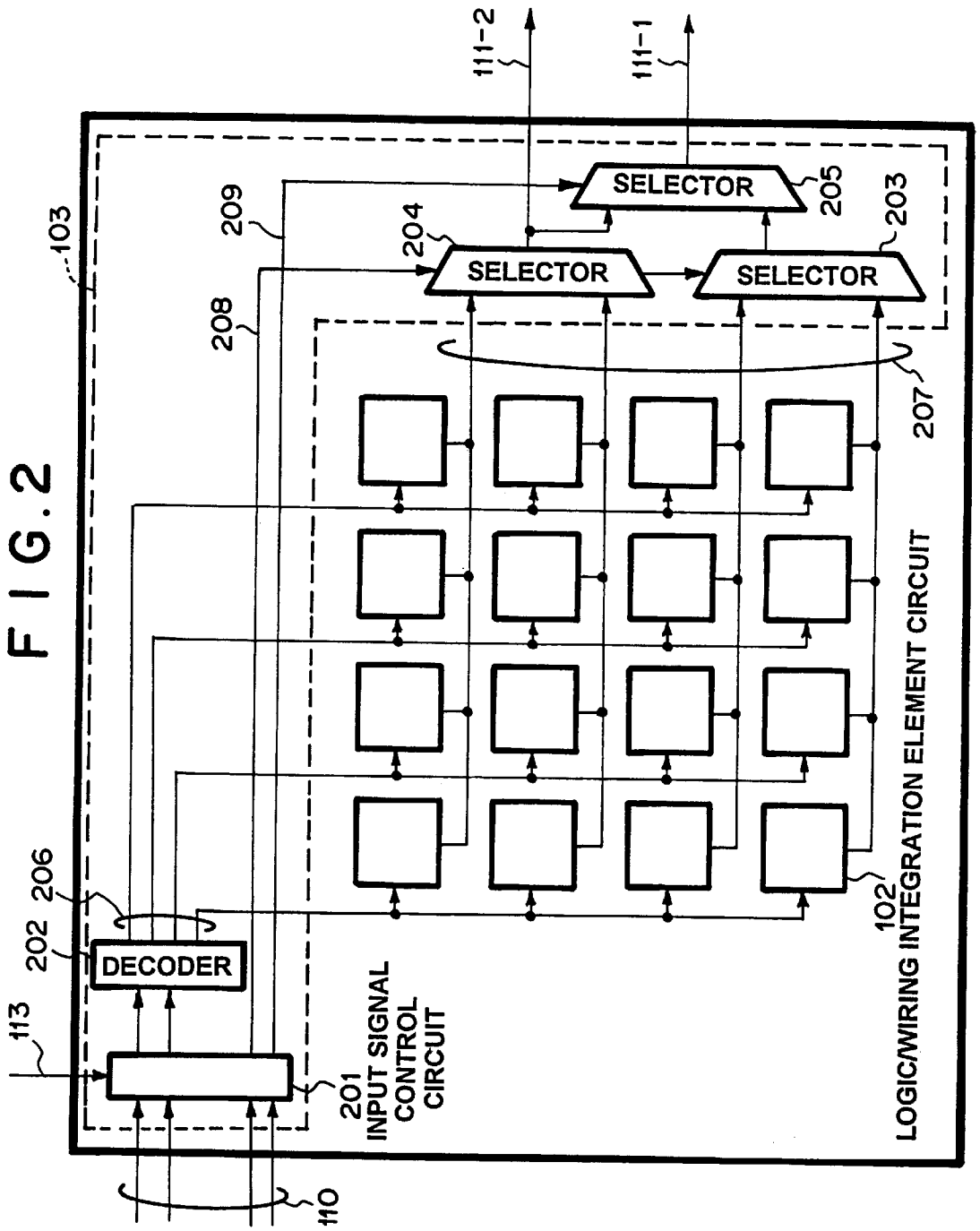
FIG. 2 is a block diagram of a logic/wiring integration circuit used as programmable logic means in the element cell as shown in FIG. 1.

A block diagram of logic/wiring integration circuit 101 as a programmable logic means is shown in FIG. 2. Logic/ wiring integration circuit 101 comprises input signal control circuit 201, decoder 202, selectors 203 to 205, and an array of logic/wiring integration unit circuits 102. Input signal control circuit 201 executes on/off control of the connection of logic/input signal lines 110 on the basis of the value of mode information signal line 113, and outputs a fixed value on the basis of the number of lines of effective logic input signal lines 110. Therefore, unnecessary signal transitions are suppressed during using the programmable wiring means and during stopping using the cells. Accordingly, the consumption power is reduced, and the circuit scale of the selectors becomes small.

Logic/wiring integration circuit 101 operates, for example, as a look-up table of 4 inputs-1 output, wherein 2 bits among the 4 bits from logic input lines 110 is fed through input signal control circuit 201 to decoder 202. Then, one of 4 read-out selection lines 206 is selected. 4 logic/wiring integration unit circuits 102 connected with each of read-out selection lines 206 outputs the stored data onto 4 read-out data lines 207. Further, one of the stored data onto 4 read-out data lines 207 is selected by selectors 203 to 207 on the basis of 2 bits on signal lines 208 and 209. Finally, 1 bit value is outputted from logic output signal line 111-1.

Logic/wiring integration circuit 101 also operates, for example, as a look-up table of 3 inputs-2 outputs, wherein 2 bits among the 3 bits are treated similarly. Selector 205 is controlled by logic output selection line 209, in such a manner that the output of selector 203 is compulsorily selected by input signal control circuit 201. Thus, 2 bits of the signals selected by logic output selection line 208 are outputted from logic output signal lines 111-1 and 111-2.

Figure 3:
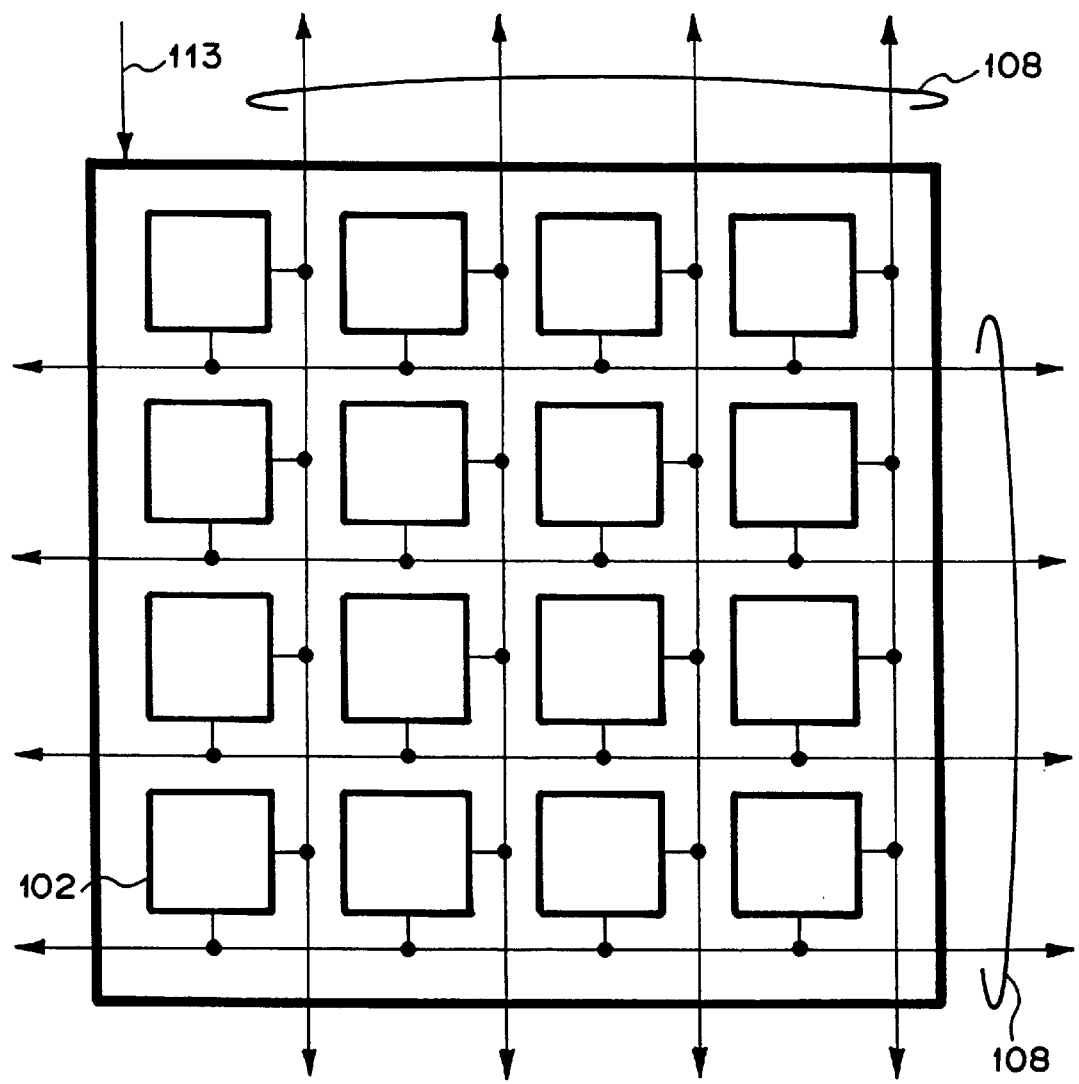
FIG. 3 is a block diagram of a logic/wiring integration circuit used as programmable wiring means in the element cell as shown in FIG. 1.

A block diagram of logic/wiring integration circuit 101 as a programmable wiring means is shown in FIG. 3. Logic/ wiring integration circuit 101 operates as the programmable wiring means on the basis of the mode information from mode information signal line 113.

Logic/wiring integration circuit 101 comprises an array of logic/wiring integration unit circuits 102 which are positioned at the crossings of longitudinal and transverse internal bi-directional connection lines 108. A 4×4 array of logic/ wiring integration unit circuits 102 is exemplified in FIG. 3.

Figure 4:
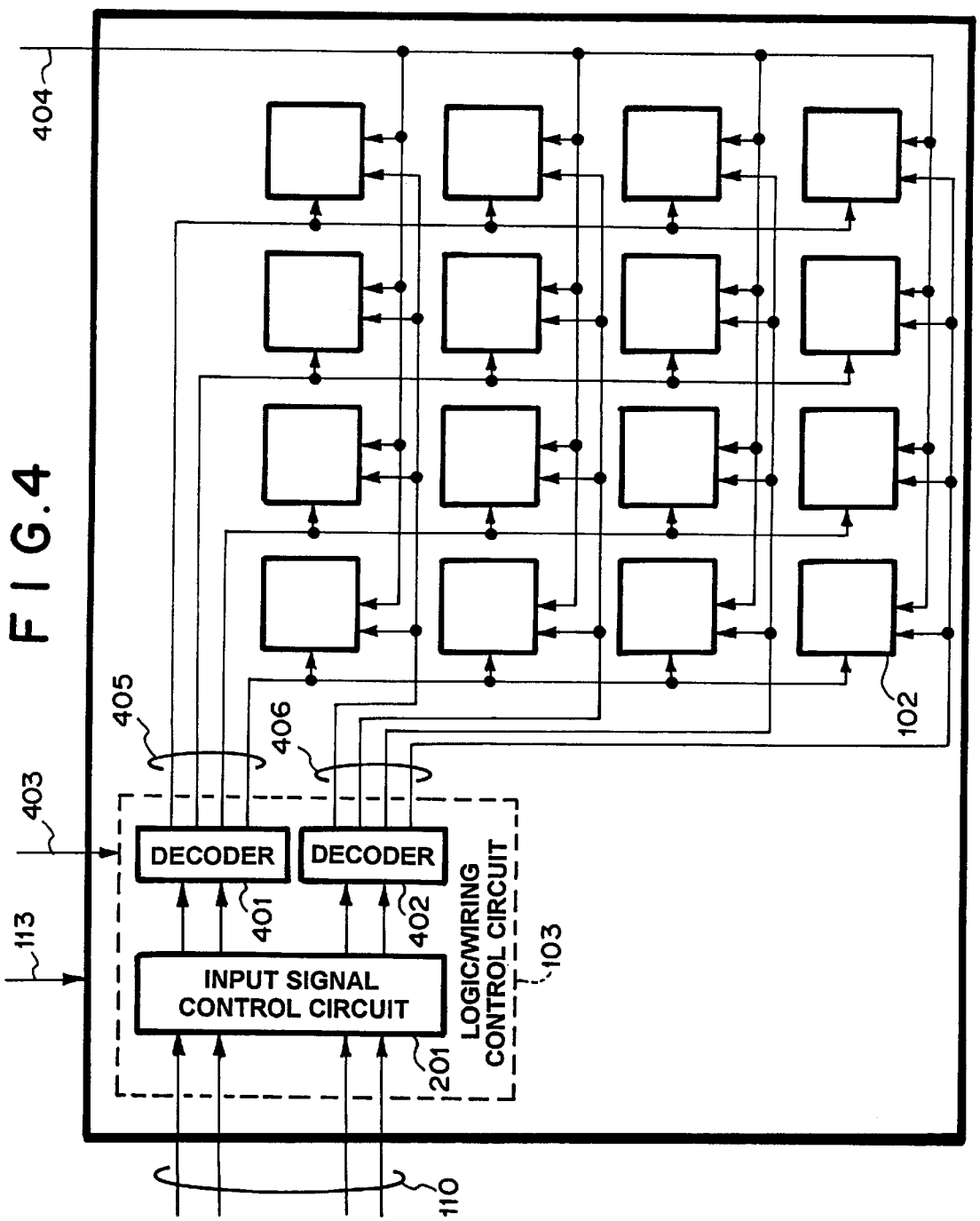
FIGS. 4 is a block diagram for explaining data write into memory means in the logic/wiring integration circuit as shown in FIG. 1.

A block diagram of logic /wiring integration circuit 101 as a memory means connected with mode information signal line 113 is shown in FIG. 4.

Logic/wiring integration circuit 101 comprises input signal control circuit 201, decoders 401 and 402, and an array of logic/wiring integration unit circuits 102. Two bits of 4 bit address inputted from logic input signal line 110 are inputted into decoders 410 and 402, respectively, to select one line among write select lines 405 and 406, respectively. Then, one of logic/wiring integration unit circuit 102 in the array stores one bit inputted from write data line 404. Write select lines 405 and 406 are allowed to output signals for selecting logic/wiring integration unit circuit 102, only when write control line 403 is activated. When write control line 403 is not activated, data are read out, by the procedures similar to the 4 input-1 output look-up table.

Figure 5:
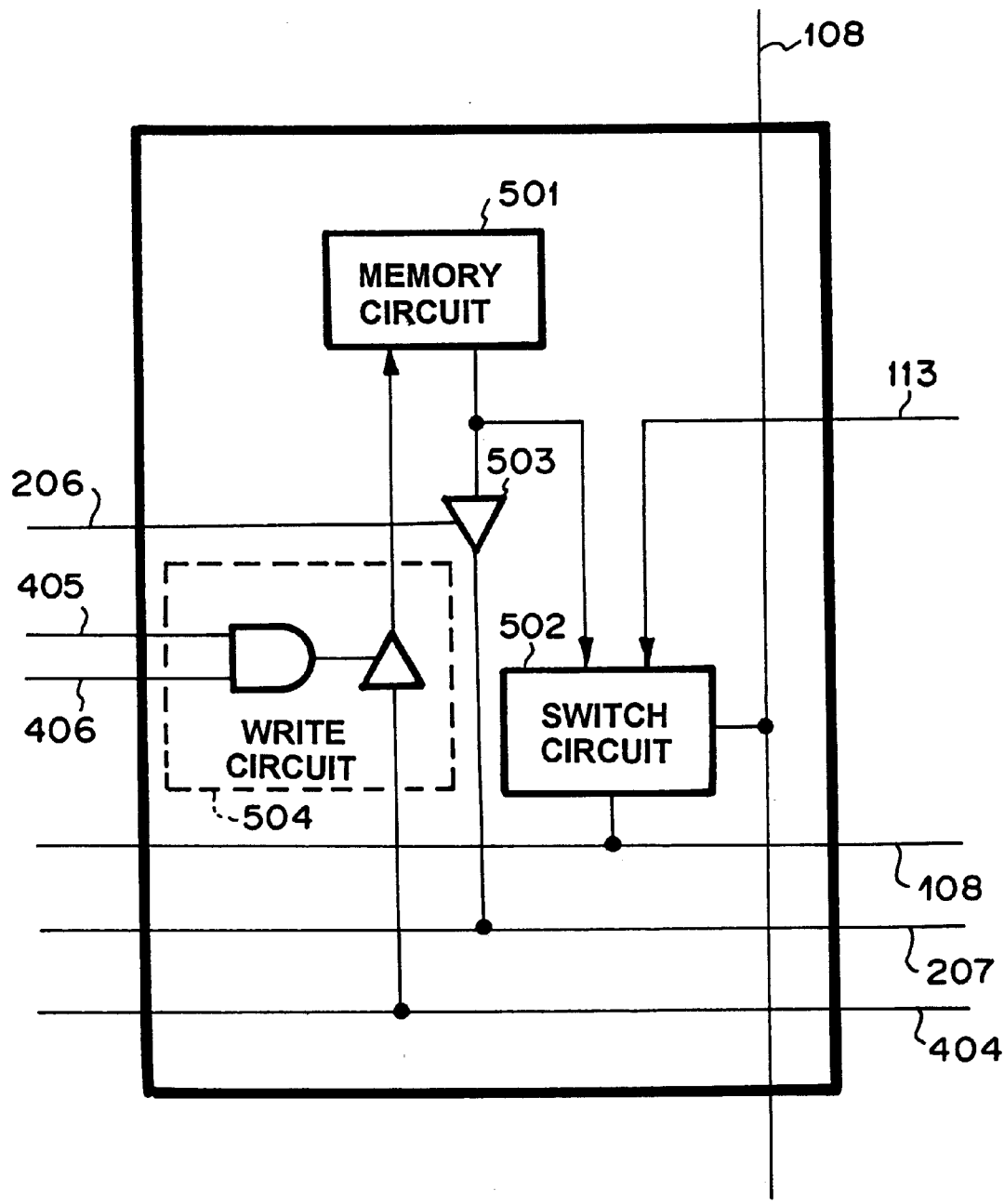
FIGS. 5 is a block diagram of a logic/wiring integration unit circuit in the logic/wiring integration circuit as shown in FIG. 1.

A block diagram of logic/wiring integration unit circuit 102 is shown in FIG. 5. Logic/wiring integration unit circuit 102 comprises memory circuit 501, switch circuit 502, read-out circuit 503, and write circuit 504.

Switch circuit 502 switches on and off the connection between internal bi-directional connection lines 108 in the horizontal and vertical directions, on the basis of the output from memory circuit 501, only when mode information signal line 113 is activated.

Read-out circuit 503 outputs the stored value from memory circuit 501 onto read-out signal line 207, when read-out select line 206 is activated.

Write circuit 504 writes the value on write signal line 404 into memory circuit 501, only when both vertical write select line 405 and horizontal write select line are selected.

Thus, logic/wiring integration circuit 101 operates as a programmable logic means, programmable wiring means, and memory means, by sharing memory circuit 501 in common.

Logic/wiring integration circuit 101 as a programmable logic means, programmable wiring means, and memory means is implemented by an array of logic/wiring integration unit circuits 102 which are identical with each other in construction. One of the above three means is selected on the basis of mode information signal line 11.

Figure 6:
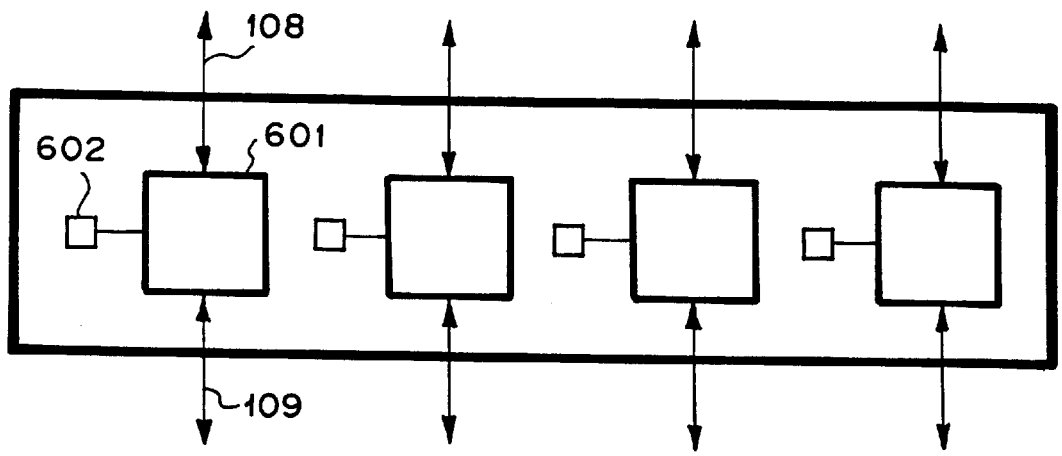
FIG. 6 is a block diagram of an inter-cell connection control circuit as shown in FIG. 1.

A block diagram of inter-cell connection control circuits 104 to 107 is shown in FIG. 6. Each of inter-cell connection control circuits 104 to 107 comprise bi-directional connection switch 601, and memory circuit 602. Bi-directional connection switch 601 switches on and off the connection between bi-directional connection line 108 and internal bi-directional connection line 109, on the basis of the value stored in memory circuit 602. Although a freedom of degree of connection is assured by assigning memory circuit 602 for each bi-directional connection switch 601, a plurality of bi-directional connection switch 601 may have a single memory circuit 602 in common.

Figure 7:
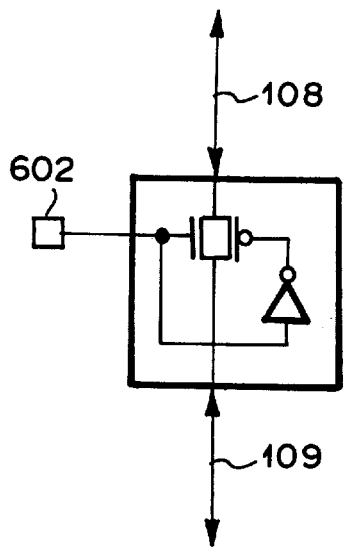
FIG. 7 is a block diagram of an example of the connection switch as shown in FIG. 6.

A circuit diagram of bi-directional connection switch 601 is shown in FIG. 7. Bi-directional connection line 108 and internal bi-directional connection line 109 as a bi-directional connection line are controlled by the one bit value of memory circuit 602.

Figure 8:
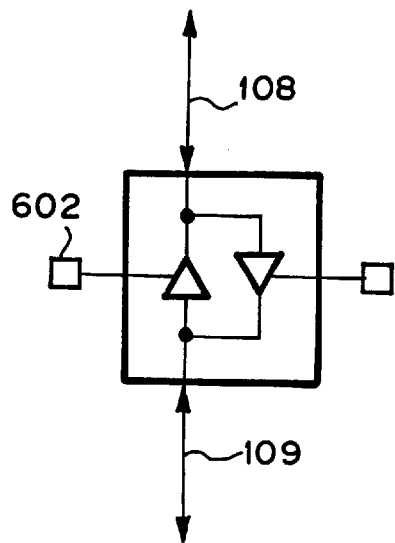
FIG. 8 is a block diagram of another example of the connection switch as shown in FIG. 6.

Another circuit diagram of bi-directional connection switch 601 is shown in FIG. 8. Bi-directional connection line 108 and internal bi-directional connection line 109 as a bi-directional connection line are controlled by the one bit value of memory circuit 602. The circuit as shown in FIG. 8 is inferior to that as shown in FIG. 7 from a point of view of a necessary number of memory circuits 602. However, circuit as shown in FIG. 8 is superior to that as shown in FIG. 7 in a point of view of signal quality, because signals become dull after passing through transfer gates in succession, when a plurality of cells in succession are used for programmable wiring means.

Figure 9:
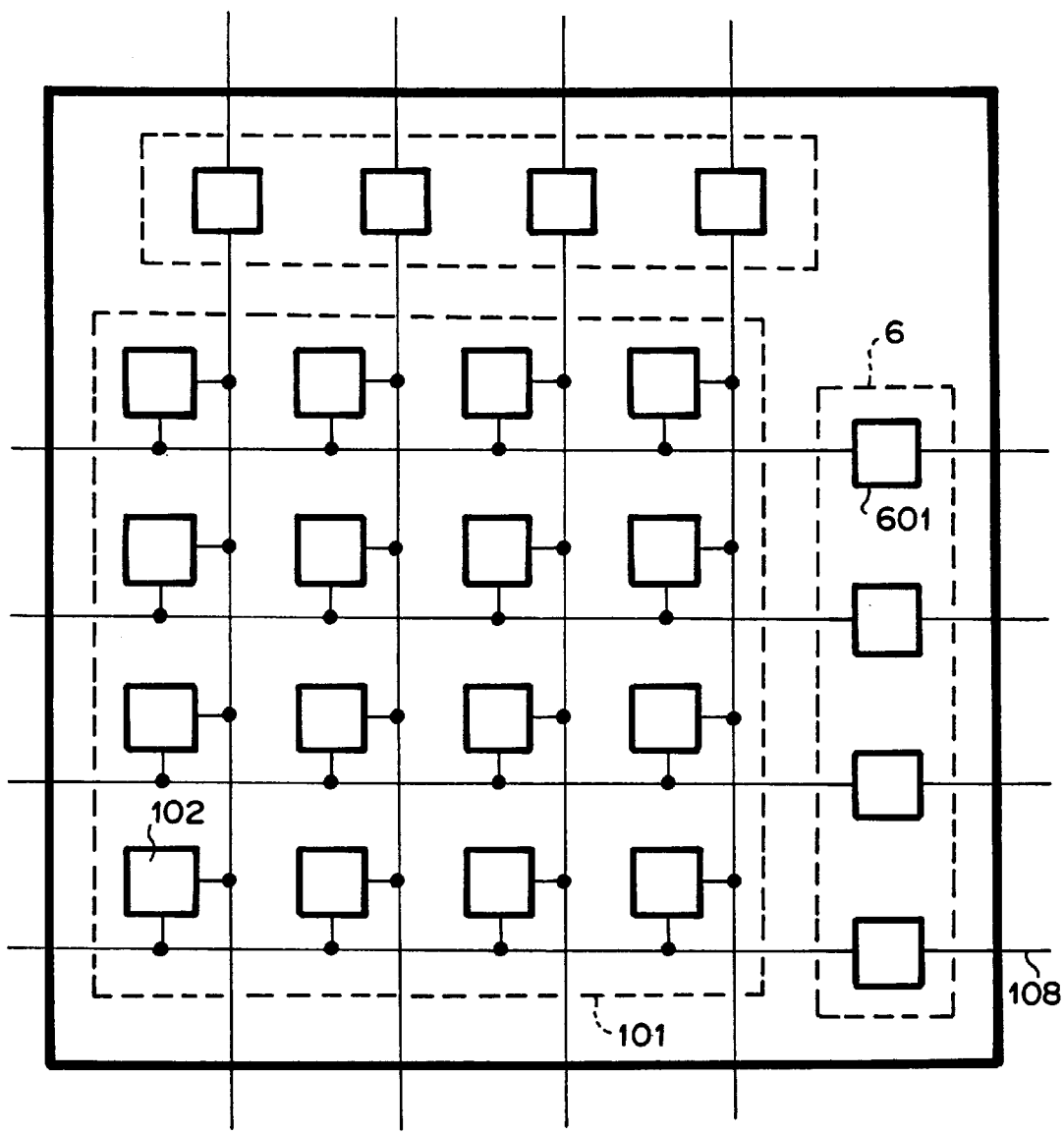
FIG. 9 is a block diagram of a part of the element cell which functions as the programmable wiring means which utilizes the inter-cell connection control circuit as shown in FIG. 6.

A block diagram of programmable logic/wiring integration means utilized for a programmable wiring means is shown in FIG. 9. Inter-cell connection control circuits 6 as shown in FIG. 6 are located on the upper side and right hand side of logic/wiring integration circuit 101, whereby each of bi-directional connection lines 108 in the vertical and horizontal directions is connected with bi-directional connection switch 601. Therefore, programmable wiring means as shown in FIG. 9 becomes a cross bar switch, or a on/off switch for an arbitrary line of bi-directional connection lines 108 in the vertical and horizontal directions. Although the cell indirect control circuits may be connected on the upper, lower, right and left sides of logic/wiring integration circuit 101 for assuring a degree of freedom of connection, the arrangement as shown in FIG. 9 is preferable in view of signal delay and circuit scale. The locations of cell indirect connection circuits are not limited to that as shown in FIG. 9.

Figure 10:
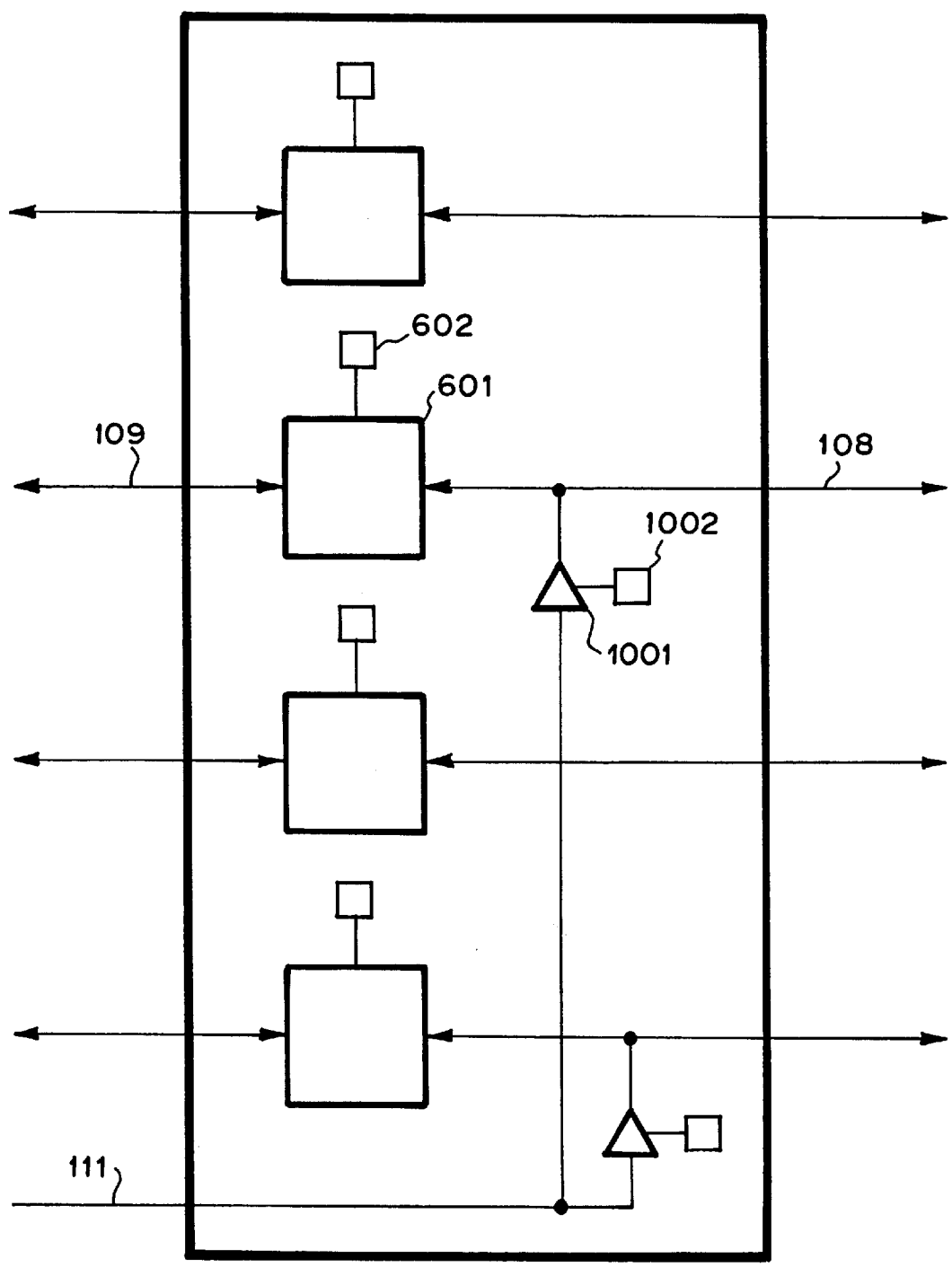
FIGS. 10 is a block diagram of the inter-cell connection control means as shown in FIG. 1 which includes output circuits and acts as a logic means.

A block diagram of another example of inter-cell connection control circuits 104 to 107 is shown in FIG. 10. Each of inter-cell connection control circuits as shown in FIG. 10 comprises bi-directional connection switch 601, memory circuit 602 and 1002 and output circuit 1001. Bi-directional connection switch 601 switches on and off the connection between bi-directional connection line 108 and internal bi-directional connection line 109, on the basis of the value stored in memory circuit 602. Output circuit 1001 outputs the value on logic output line 111 toward bi-directional connection line 108 selected on the basis of the value stored in memory circuit 1002. Here, the value stored in memory circuit 1002 may be replaced by the value on mode information signal line 113. Further, the location and number of output circuits 1001 are not limited to the example as shown in FIG. 10. Furthermore, the value on logic output line my be outputted toward a plurality of inter-cell connection control circuits different from each other. Although each of bi-directional connection lines 108 can be connected with output circuit 1001, it is better to limit and optimize the location and number of output circuits 1001, taking a delay due to increasing load capacity and a circuit scale into consideration.

Figure 11:
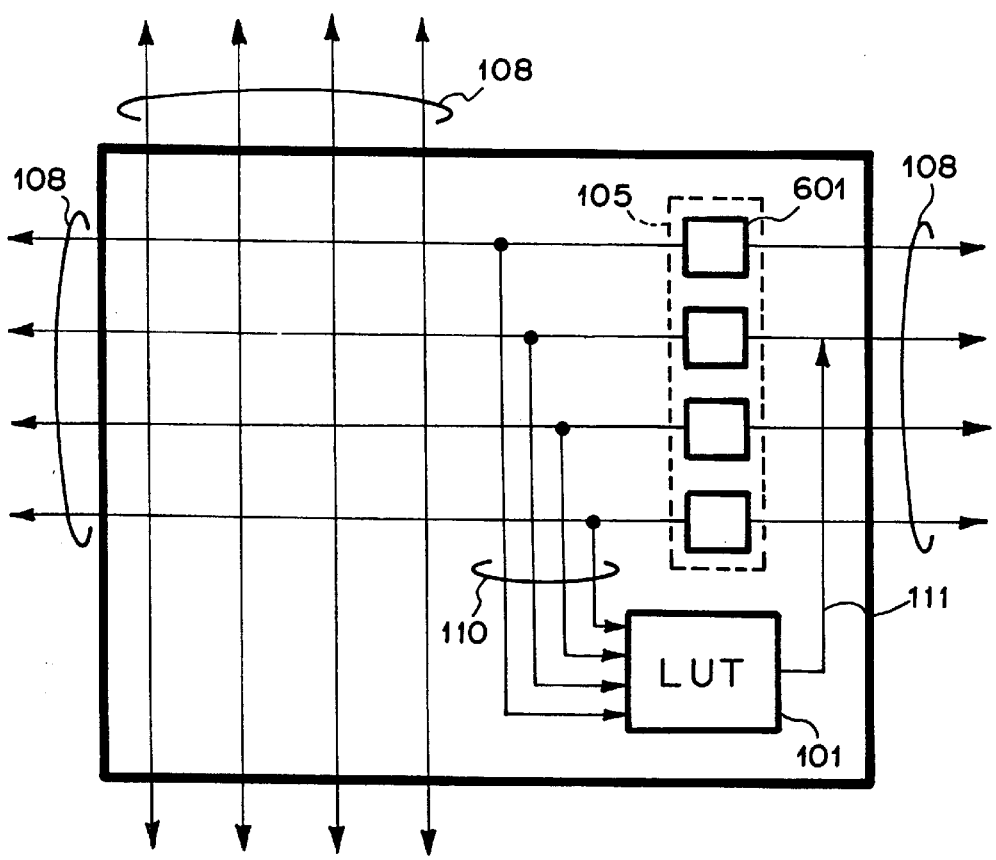
FIGS. 11 is a block diagram of the inter-cell connection control means as shown in FIG. 1 which utilizes bi-directional connection lines.

A block diagram of a part of programmable logic/wiring integration circuit 101 utilized for a programmable logic means is shown in FIG. 11. Programmable logic/wiring integration circuit 101 is connected with inter-cell connection control circuit 105.

As shown in FIG. 11, the values on bi-directional connection lines 108 are fed through logic input signal lines 110 into logic/wiring integration circuit 101 as a look-up-table LUT. Then, the output from LUT is outputted through logic output signal line 111 onto the second upper-most line among horizontal bi-directional connection lines 108, under the condition that the second upper-most bi-directional switch 601 is switched off so as to avoid the collision of input signal and output signal of LUT.

The programmable logic means as shown in FIG. 11 becomes a wiring means. For example, when the connection switches in inter-cell connection control circuit 105 except the second upper-most connection switch is switched on, the values on bi-directional connection lines 108 are transferred toward both right and left directions of bi-directional connection lines 108. In this case, the input signal for the LUT can be given from the right hand side of bi-directional connection lines 108 as shown in FIG. 11. Further, for example, when the second upper-most connection switch in inter-cell connection control circuit 105 is switched on, the output from the LUT can be utilized again as an input into the LUT.

Further, the vertical bi-directional connection lines 108 which remain unused may be utilized for wiring means, whereby a cell which is operating as a logic means can also operate as wiring means which connects adjacent cells positioned along the vertical direction.

Figure 12:
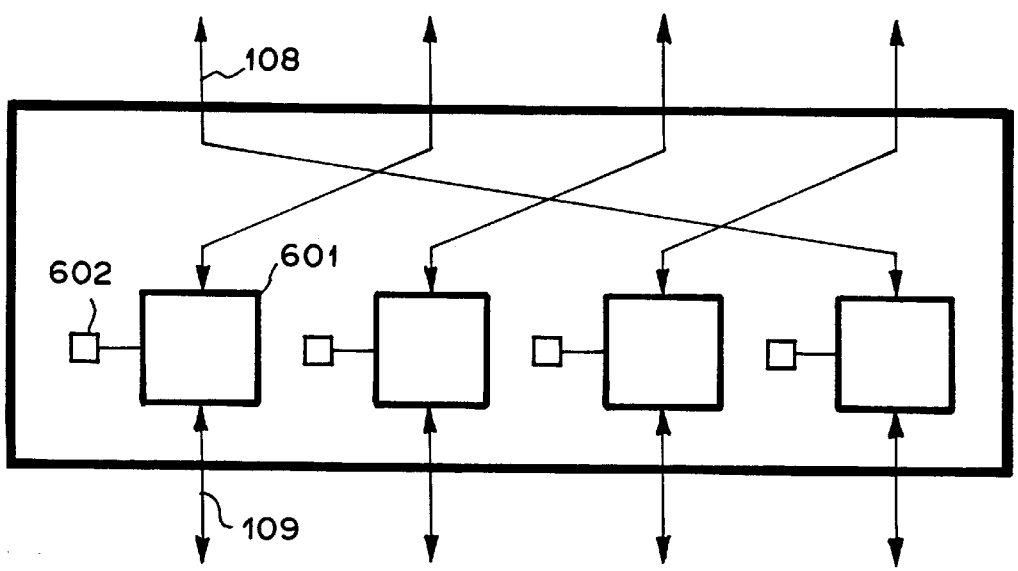
FIG. 12 is a block diagram of inter-cell connection control circuit as shown in FIG. 1, wherein the bi-directional connection lines are twisted.

A block diagram of another inter-cell connection control circuits 104 to 107 is shown in FIG. 12. Each of inter-cell connection control circuits 104 to 107 comprises bi-directional connection switch 601 and memory circuit 602. Bi-directional connection line 108 is connected through bi-directional connection switch 601 with internal bi-directional connection line 109 which is located at the left side of connection line 108. Therefore, the operation of the inter-cell connection control circuit as shown in FIG. 12 is the same as that as shown in FIG. 10.

Figure 13:
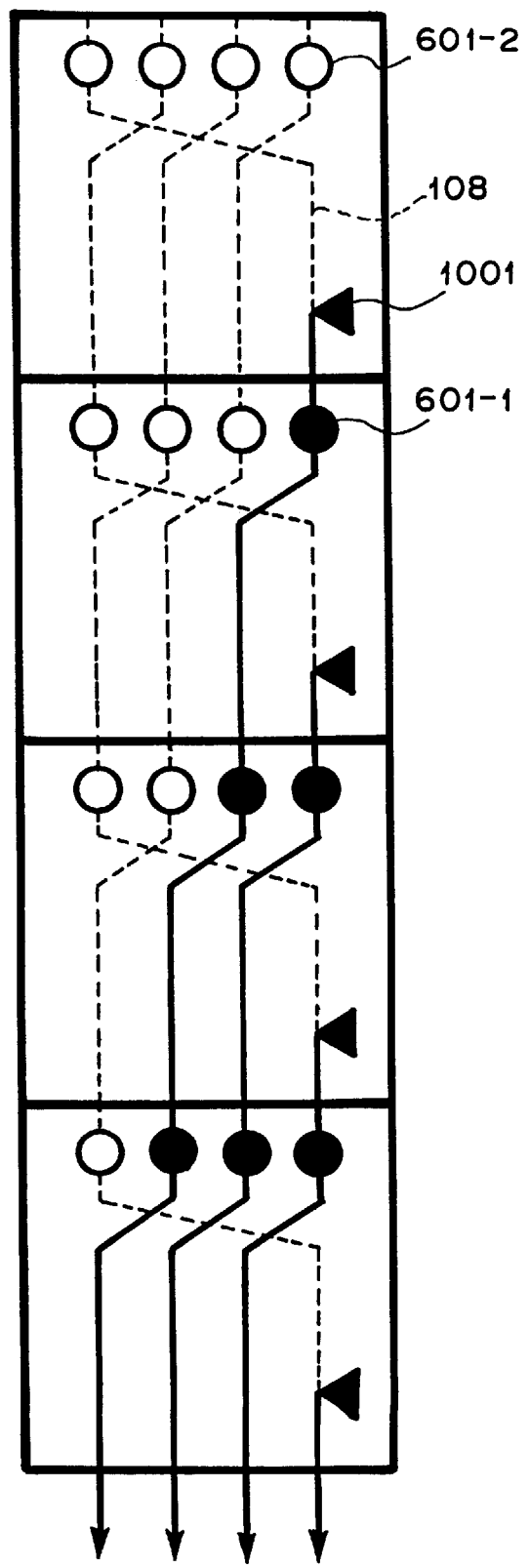
FIGS. 13 is a block diagram of an example of a vertical arrangement of output circuits connected with bi-directional connection switches 601 as shown in FIG. 12 which is located, for example, at the right edge of the horizontal arrangement.

An example is shown in FIG. 13 for explaining the output obtained by a vertical arrangement of output circuits 1001 connected with bi-directional connection switches 601 as shown in FIG. 12 which is located, for example, at the right edge of the horizontal arrangement. For example, bi-directional connection switch 601-1 is switched on, while bi-directional connection switch 601-2 is switched off, as shown in FIG. 13. In this case, the outputs from four output circuits 1001 can be propagated along the bold lines as shown in FIG. 13.

A block diagram of still another inter-cell connection control circuits 104 to 107 is shown in FIG. 14. Connection switch 150 accompanied by memory circuit 602 is added to the inter-cell connection control circuit as shown in FIG. 12. Connection switch 1501 switches on and off the connection between second left bi-directional connection line 108 and second left internal bi-directional line 109. The operation of the inter-cell connection control circuit as shown in FIG. 14 is the same as that as shown in FIG. 12.

Figure 15:
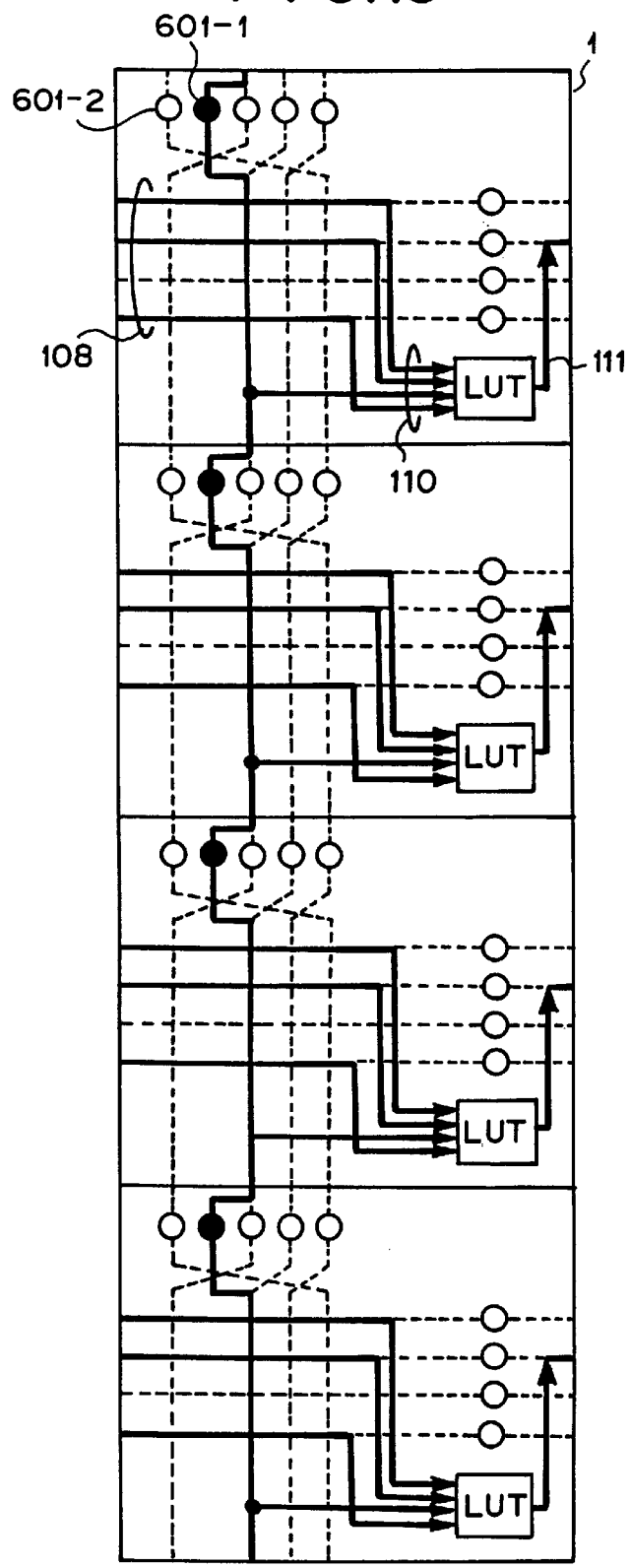
FIG. 15 is a block diagram of a vertical arrangement of look-up-tables (LUTs) of which inputs are common.

Each of cells 1 as shown in FIG. 15 accepts three inputs from bi-directional connection lines 108 at the left hand side and one input from vertical bi-directional connection line 108 through bi-directional connection switch 601-1. Thus, only one switch, for example, bi-directional connection switch 601-1 among the twisted arrangement of vertical bi-directional connection switches is required for obtaining a common input into LUTs in each of cells 1.

Figure 16:
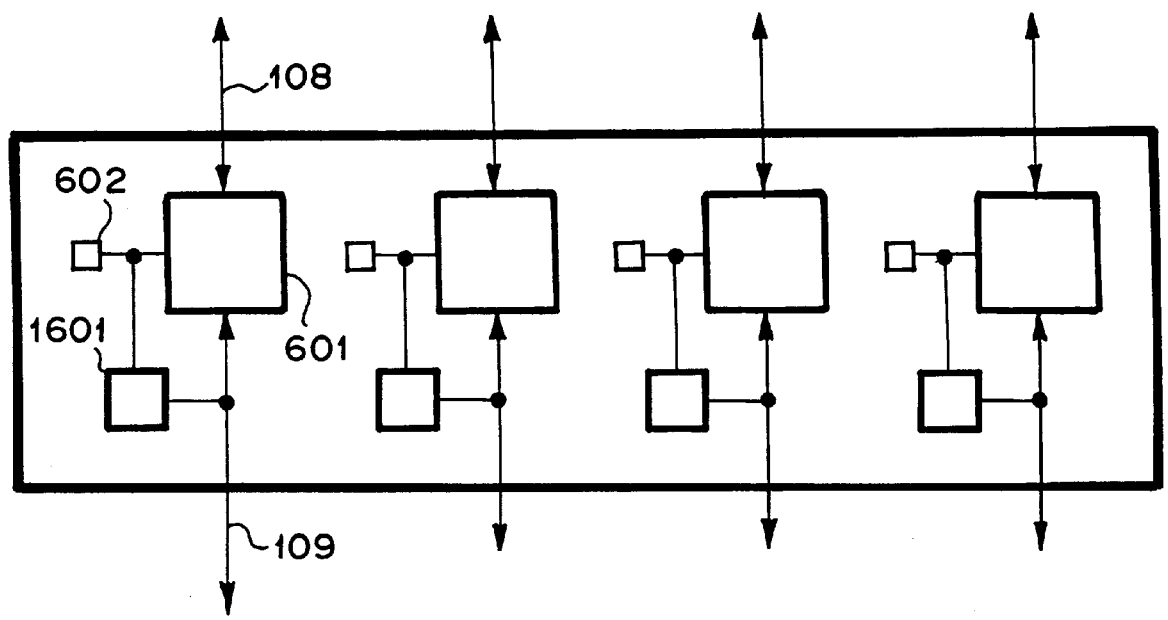
FIGS. 16 is a block diagram of an example of an inter-cell connection control circuit for avoiding floating on the bi-directional connection lines.

A block diagram of still further another inter-cell connection control circuits 104 to 107 is shown in FIG. 16. Inter-cell connection circuit as shown in FIG. 16 comprises bi-directional connection switch 601, memory circuit 602, and latch 1601. The logic value on internal bi-directional connection line 109 is kept by latch circuit 1601, only when bi-directional connection switch 601 is switched off on the basis of the value stored in memory circuit 602, whereby the floating states of bi-directional connection line 108 and internal bi-directional connection line 109 can be automatically avoided.

Figure 17:
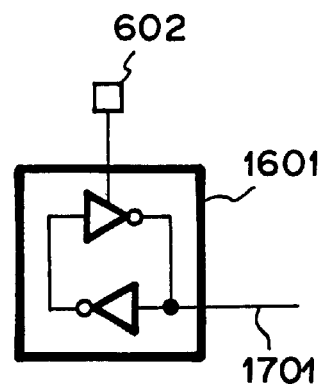
FIGS. 17 is a block diagram of a latch included in the inter-cell connection control circuit as shown in FIG. 16.

A block diagram of an example of latch 1601 is shown in FIG. 17. The signal 1701 is latched on the basis of the value stored in memory circuit 602.

Figure 18:
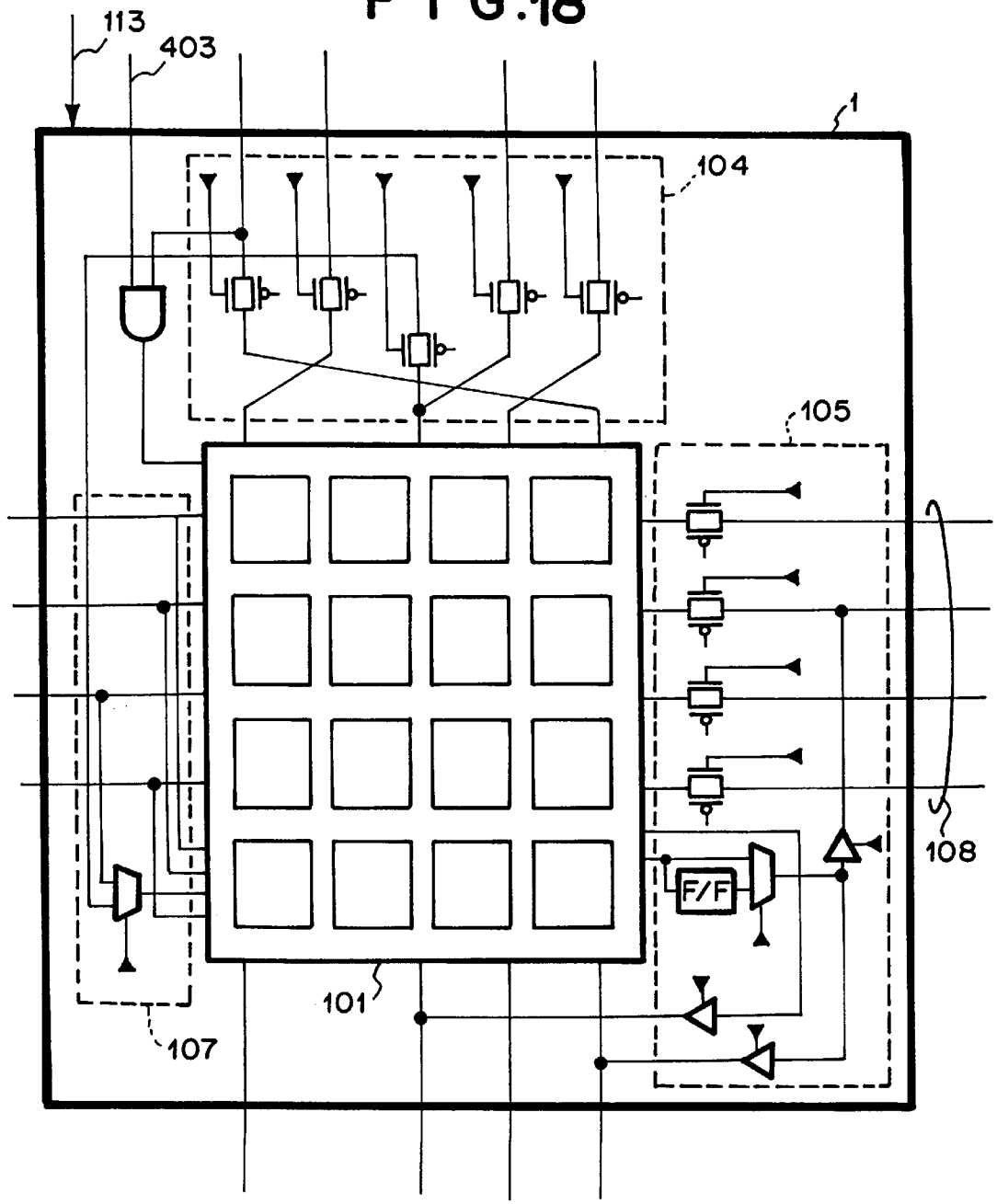
FIG. 18 is a block diagram of an example of the unit cell as shown in FIG. 1.

A block diagram of a detailed example of element cell 1 of the programmable logic LSI of the present invention is shown in FIG. 18. Suitable circuits for inter-cell connection control circuits 104, 105 and 107 are selected from among the circuits as shown in FIGS. 6, 19, 12 and 14.

What is claimed is:

1. A programmable logic LSI which includes a two dimensional array of element cells which functions as programmable wiring means, programmable logic means and memory means, wherein each of said element cells comprises:

a plurality of inter-cell connection control circuits for controlling connections between said element cells; and a logic/wiring integration circuit for operating as a crossbar switch as said wiring means and for inputting and outputting logic signals as said logic means and said memory means.

2. The programmable logic LSI according to claim 1, wherein said inter-cell connection control circuit controls said connections between said element cells which are adjacent with each other in said two dimensional array.

3. The programmable logic LSI according to claim 1, wherein said logic/wiring integration circuit comprises:

a plurality of memory circuits for storing said logic signals;

a plurality of read-out circuits for reading out said logic signals stored in said memory circuit; and a plurality of switches for switching on and off said connections between said element cells.

4. The programmable logic LSI according to claim 3, wherein said logic/wiring integration circuit further comprises a plurality of write circuit for writing said logic signals into said memory circuits.

5. The programmable logic LSI according to claim 1, wherein a part of a plurality of said element cells outputs said logic signals toward said element cells which are adjacent with each other.

6. The programmable logic LSI according to claim 1, wherein a part of said plurality of inter-cell connection control circuits functions as said programmable means.

7. The programmable logic LSI according to claim 1, wherein said element cells are connected with the element cells which are adjacent to said element cells, by using connection lines which are twisted on said two dimensional array.

8. The programmable logic LSI according to claim 1, wherein:

parts of a plurality of said element cells are connected with the element cells which are adjacent to said parts, by using connection lines which are twisted on said two dimensional array; and rest parts of said plurality of said element cells are connected with the element cells which are adjacent with said rest parts, by using connection lines which are not twisted on said two dimensional array.

9. The programmable logic LSI according to claim 7, wherein each of parts of a plurality of said element cells further comprises:

an output circuit for outputting said logic signals; and a latch circuit for keeping said logic signals on said connection lines.

10. The programmable logic LSI according to claim 8, wherein each of parts of a plurality of said element cells further comprises:

an output circuit for outputting said logic signals; and a latch circuit for keeping said logic signals on said connection lines.

11. The programmable logic LSI according to claim 9, wherein said latch is controlled by one of logic values stored in said programmable logic LSI.

12. The programmable logic LSI according to claim 10, wherein said latch is controlled by one of logic values stored in said programmable logic LSI.

* * * * *